(12) United States Patent
Chen et al.

(10) Patent No.: US 11,373,879 B2
(45) Date of Patent: *Jun. 28, 2022

(54) CHEMICAL MECHANICAL POLISHING METHOD

(71) Applicant: TAIWAN SEMICONDUCTOR MANUFACTURING COMPANY LTD., Hsinchu (TW)

(72) Inventors: Tung-Kai Chen, New Taipei (TW); Ching-Hsiang Tsai, Hsinchu (TW); Kao-Feng Liao, Hsinchu (TW); Chih-Chieh Chang, Hsinchu County (TW); Chun-Hao Kung, Hsinchu (TW); Fang-I Chih, Tainan (TW); Hsin-Ying Ho, Kaohsiung (TW); Chia-Jung Hsu, Changhua County (TW); Hui-Chi Huang, Hsinchu County (TW); Kei-Wei Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/019,234

(22) Filed: Sep. 12, 2020

(65) Prior Publication Data
US 2020/0411329 A1     Dec. 31, 2020

Related U.S. Application Data

(63) Continuation of application No. 16/003,111, filed on Jun. 8, 2018, now Pat. No. 10,777,423.

(Continued)

(51) Int. Cl.
*H01L 21/321* (2006.01)
*H01L 21/3105* (2006.01)
*H01L 21/28* (2006.01)

(52) U.S. Cl.
CPC ........ *H01L 21/3212* (2013.01); *H01L 21/28* (2013.01); *H01L 21/31053* (2013.01)

(58) Field of Classification Search
CPC  H01L 21/3212; H01L 21/28; H01L 21/31053
See application file for complete search history.

(56) References Cited

U.S. PATENT DOCUMENTS

| 10,507,563 | B2 | 12/2019 | Mitsumoto et al. |
| 2003/0168627 | A1 | 9/2003 | Singh et al. |
| 2010/0164106 | A1* | 7/2010 | Lee .......................... C09G 1/02 257/751 |

FOREIGN PATENT DOCUMENTS

TW        201704441 A      2/2017

OTHER PUBLICATIONS

Office action dated Aug. 24, 2021 for counterpart Taiwan application 107135455.
U.S. Pat. No. 10,507,563 is the counterpart for TW201704441.

* cited by examiner

*Primary Examiner* — Anita K Alanko
(74) *Attorney, Agent, or Firm* — WPAT, P.C., Intellectual Property Attorneys; Anthony King

(57) ABSTRACT

A planarization method and a CMP method are provided. The planarization method includes providing a substrate with a first region and a second region having different degrees of hydrophobicity or hydrophilicity and performing a surface treatment to the first region to render the degrees of hydrophobicity or hydrophilicity in proximity to that of the second region. The CMP method includes providing a substrate with a first region and a second region; providing (Continued)

a polishing slurry on the substrate, wherein the polishing slurry and the surface of the first region have a first contact angle, and the polishing slurry and the surface of the first region have a second contact angle; modifying the surface of the first region to make a contact angle difference between the first contact angle and the second contact angle equal to or less than 30 degrees.

20 Claims, 18 Drawing Sheets

Related U.S. Application Data

(60) Provisional application No. 62/590,068, filed on Nov. 22, 2017.

CHEMICAL MECHANICAL POLISHING METHOD

CROSS REFERENCE TO RELATED APPLICATIONS

This application is a continuation of application Ser. No. 16/003,111, filed on Jun. 8, 2018, now allowed, which claims priority of U.S. provisional application Ser. No. 62/590,068 filed on Nov. 22, 2017. All of which are incorporated by reference in their entirety.

BACKGROUND

Chemical mechanical polishing (CMP) is frequently used in integrated circuit fabrications to reduce the thickness of a wafer or its overlying layer(s) and to planarize the surface of the wafer or its overlying layer(s). However. CMP suffers from material dishing. There is a need to modify CMP in order to mitigate material dishing issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
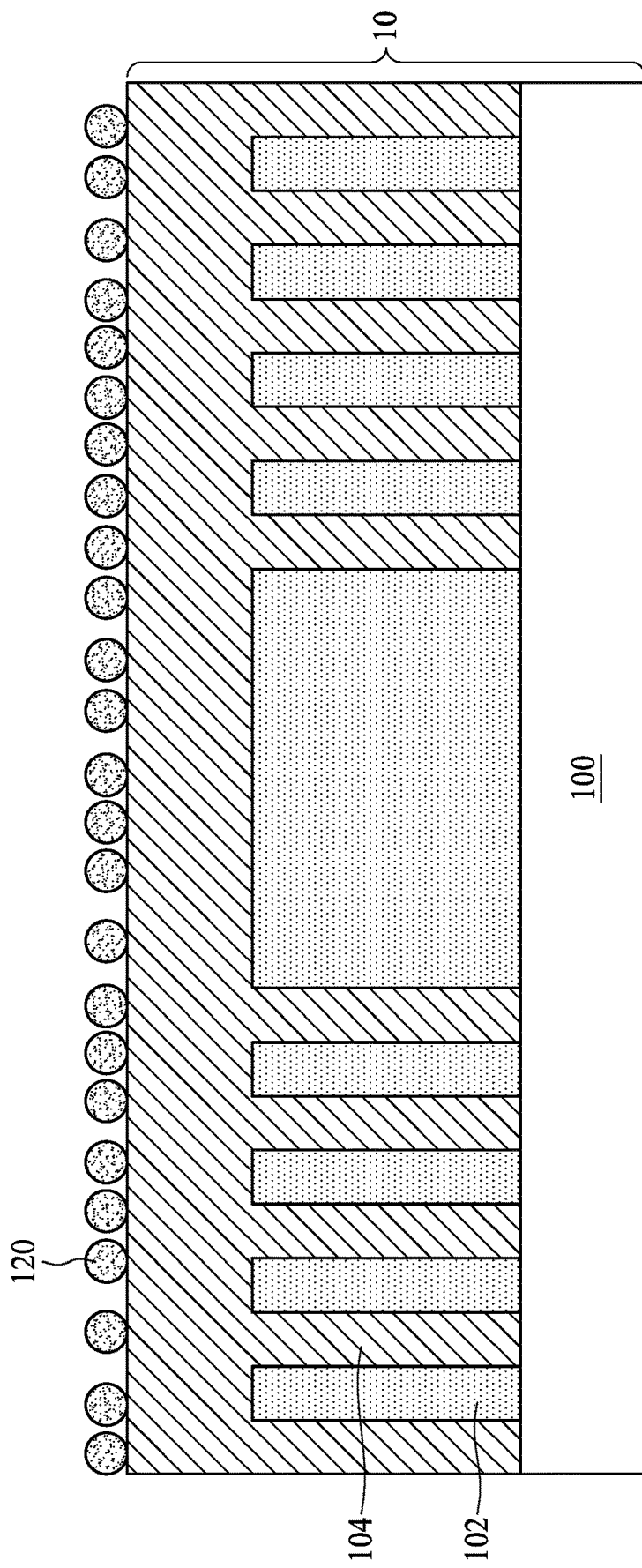
FIG. 1A, FIG. 1B and FIG. 1C are schematic cross-sectional views illustrating a chemical mechanical polishing (CMP) method in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, operations, elements, and/or components, but do not preclude the presence or addition of one or more other features, regions, integers, operations, elements, components, and/or groups thereof.

Furthermore, spatially relative terms, such as "beneath." "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "substantially" refers to the complete or nearly complete extent or degree of an action, characteristic, property, state, structure, item, or result. For example, a surface that is "substantially" coplanar with another surface would mean that these two surfaces are either completely located in the same plane or nearly completely located in the same plane. The exact allowable degree of deviation from absolute completeness may in some cases depend on the specific context. However, generally speaking the nearness of completion will be so as to have the same overall result as if absolute and total completion is obtained.

As used herein, the term "polishing slurry" refers to include an aqueous mixture having a chemical composition that may enhance, reduce, or otherwise modify a substrate polishing rate. In some cases, the polishing slurry may also include polishing abrasives, chemical reagents and other additives.

As used herein, the term "contact angle" is defined as the angle formed by a drop of liquid in contact with the surface of the substrate. The value of the contact angle indicates the degree of hydrophobicity or hydrophilicity of the substrate. In some cases, when the contact angle is equal to or greater than 90 degrees, the substrate is hydrophobic. When the contact angle is less than 90 degrees, the substrate is hydrophilic.

Figure 1B:
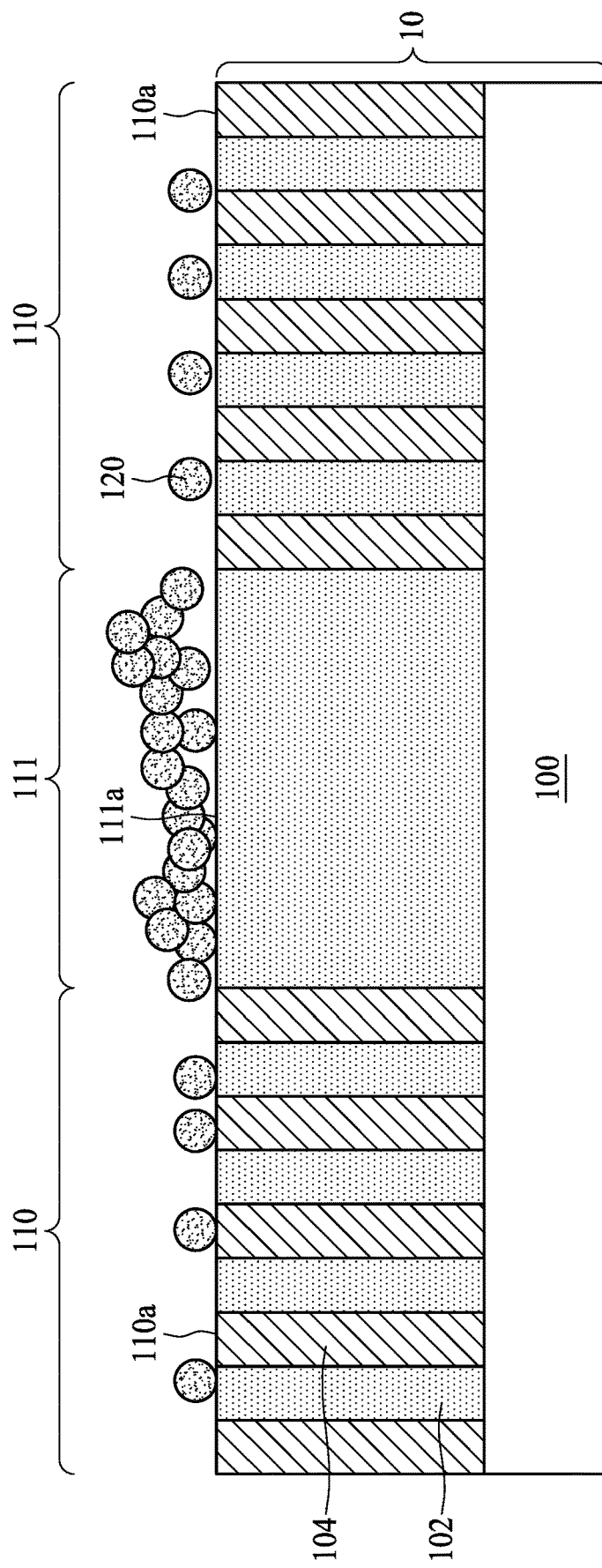
Figure 1C:
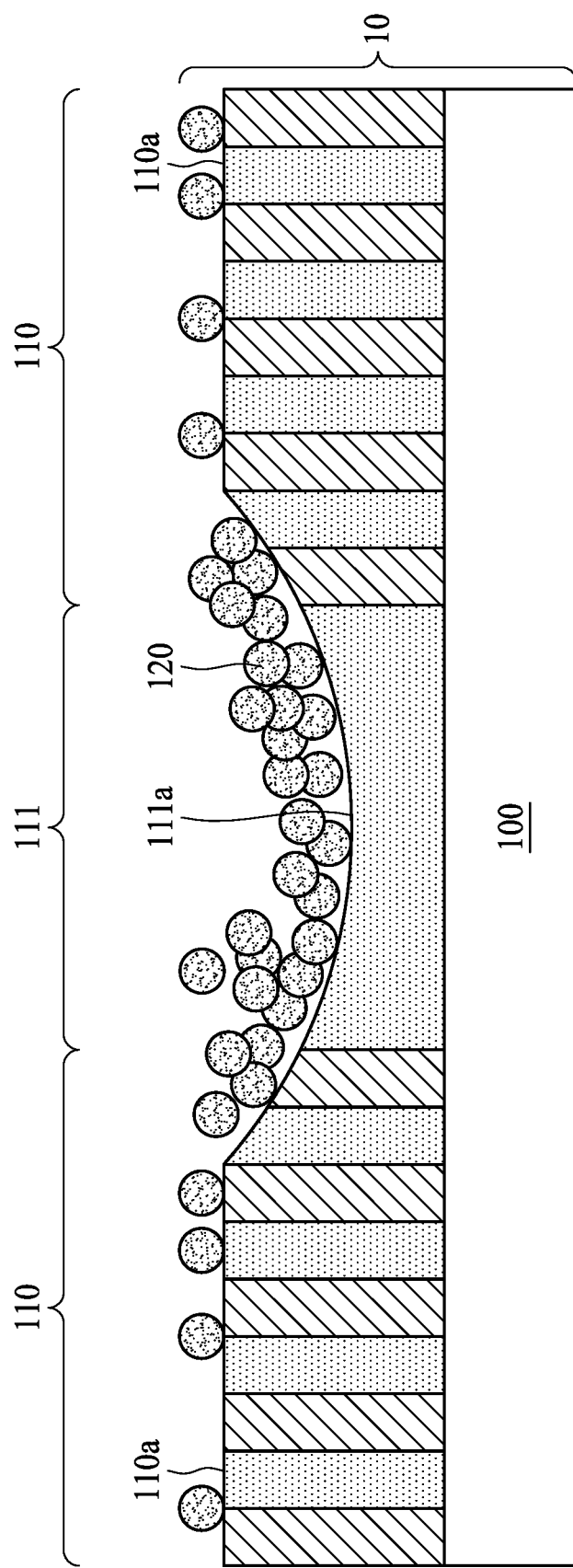

FIG. 1A. FIG. 1B and FIG. 1C are schematic cross-sectional views illustrating a chemical mechanical polishing (CMP) method in accordance with some embodiments of the present disclosure. As shown in FIG. 1A, a semiconductor structure 10 is provided. In some embodiments, the semiconductor structure 10 includes a substrate 100, a first material 102 and a second material 104. The first material 102 and the second material 104 have different degrees of hydrophobicity or hydrophilicity. The first material 102 may be configured as dielectric layer, and the second material 104 may be configured as conductive vias. The second material 104 over the first material 102 may need to be removed to form a plurality of separated conductive vias, and the surface of the first material 102 and the second material 104 may need to be planarized for successive operations. A polishing slurry 120 may be dispensed over the semiconductor structure 10, and a CMP operation may be performed to remove the second material 104 over the first material 102. As shown in FIG. 1A, since the second material 104 has the same degree of hydrophobicity or hydrophilicity, the abrasives of the polishing slurry 120 may be uniformly distributed over the second material 104, and the polishing rate is substantially uniform throughout the second material 104 at the beginning of the CMP operation.

As shown in FIG. 1B, when the second material 104 over the first material 102 is polished by the CMP operation, a first region 110 and a second region 111 formed from different materials will be formed. The first region 110 and the second region 111 have different degrees of hydrophobicity or hydrophilicity. In some embodiments, the first region 110 is a hydrophobic region and the second region 111 is a hydrophilic region. The hydrophobic first region 110 includes a hydrophobic surface 110a and the hydrophilic second region 111 includes a hydrophilic surface 11a. Due to the different degrees of hydrophobicity or hydrophilicity between the first region 110 and the second region 111, the polishing slurry 120 are tended to approach and concentrate on the hydrophilic surface 111a than on the hydrophobic surface 110a.

As shown in FIG. 1C, the polishing rate in the hydrophilic second region 111 with more polishing slurry 120 is higher than the polishing rate in the hydrophobic first region 110 with less polishing slurry 120, and therefore the concentrated polishing slurry 120 may cause dishing in the hydrophilic region 111 during the CMP operation.

In some embodiment of the present disclosure, a planarization method is provided to mitigate dishing of the substrate or the overlying layer(s) on the substrate. The method may include a surface treatment by adding a pH adjuster, a surfactant or a corrosion inhibitor to the polishing slurry. In some embodiments, the pH adjuster may modify the polishing slurry 120 to an alkaline or an acidic condition, which may help to transform a material of the hydrophobic region into another hydrophilic material. In some embodiments, the surfactant or the corrosion inhibitor are configured to selectively bonded to the surface of one of the hydrophobic region and the hydrophilic region to alter the degree of hydrophobicity or hydrophilicity, and thus may render its degree of hydrophilicity of the hydrophobic region similar to that of the surface of the other one of the hydrophobic region and the hydrophilic region. In some embodiments, the surfactant or the corrosion inhibitor tends to bond to one of the hydrophobic region and the hydrophilic region than to the other one of the hydrophobic region and the hydrophilic region by ionic bond, hydrogen bond or the like. Therefore, the polishing slurry will be uniformly dispersed on the hydrophobic region and the hydrophilic region such that dishing can be mitigated.

In some embodiments of the present disclosure, a planarizing method is disclosed. In some embodiments, a substrate is polished by a planarizing method 200. The method 200 includes a number of operations, and the description and illustration are not deemed as a limitation as the sequence of the operations.

Figure 2:
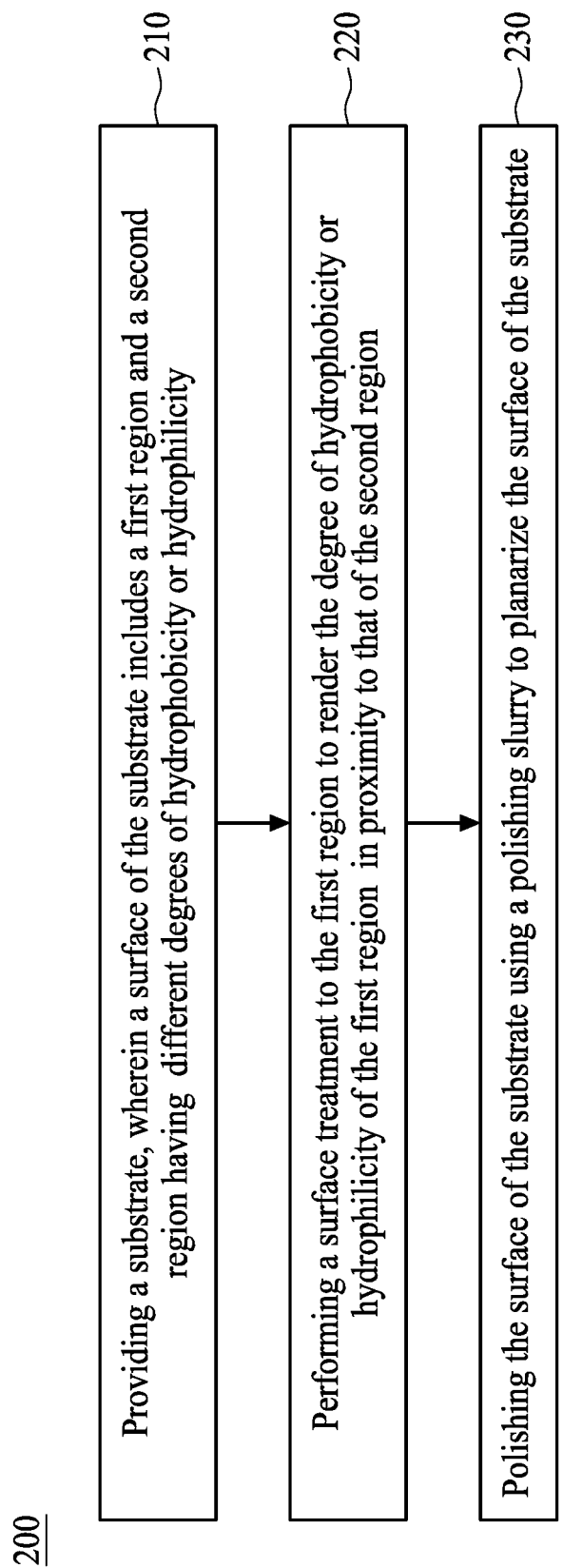
FIG. 2 is a flowchart illustrating a method for planarizing a substrate in accordance with various aspects of the present disclosure.

FIG. 2 is a flowchart illustrating a method for planarizing a substrate in accordance with various aspects of the present disclosure. The method 200 begins with operation 210 in which a substrate is provided, wherein a surface of the substrate includes a first region and a second region having different degrees of hydrophobicity or hydrophilicity. The method 200 continues with operation 220 in which a surface treatment is performed to the first region to render the degree of hydrophobicity or hydrophilicity of the first region in proximity to the degree of hydrophobicity or hydrophilicity of the second region. The method 200 proceeds with operation 230 in which the surface of the substrate is polished using a polishing slurry to planarize the surface of the substrate.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

In some embodiments, the surface treatment is performed by transforming a material of the first region into another material having a degree of hydrophobicity or hydrophilicity similar to a degree of hydrophobicity or hydrophilicity of a material of the second region. In some embodiments, the material of the first region is transformed into another material by adding a pH adjuster to the polishing slurry. The pH adjuster may help to modify the polishing slurry to an alkaline or an acidic condition, which may help to transform the original material of the first region into another material having the degree of hydrophobicity or hydrophilicity similar to that of the material of the second region. Accordingly, the polishing rates in the first region and the second region are similar, and dishing during CMP operation can be alleviated. In some embodiments, the pH adjuster includes maleic acid, sulfuric acid, nitric acid, potassium hydroxide, amine, sodium hypochlorite, tetramethylammonium hydroxide (TMAH), ammonium, or a combination thereof, but the material of the pH adjuster is not limited thereto.

In some embodiments, the surface treatment is performed by adding a surfactant to the polishing slurry. In some embodiments, the surfactant is liable to bond to the surface of the first region than to the surface of the second region by ionic bond, hydrogen bond or the like. In some embodiments, the surfactant includes a functional group having a degree of hydrophobicity or hydrophilicity similar to a degree of hydrophobicity or hydrophilicity of a material of the second region. As the surfactant bonds to the surface of the first region, the surface of the first region and the surface of the second region may have similar degree of hydrophobicity or hydrophilicity. Accordingly, the polishing rates in the first region and the second region are similar, and dishing during CMP operation can be alleviated. In some embodiments, the surfactant includes an anionic surfactant, a cationic surfactant, an amphoteric surfactant, a nonionic surfactant, or a combination thereof.

In some embodiments, the surface treatment is performed by adding a corrosion inhibitor to the polishing slurry. In some embodiments, the corrosion inhibitor is liable to bond to the surface of the first region than to the surface of the second region by ionic bond, hydrogen bond or the like. In some embodiments, the corrosion inhibitor has a degree of hydrophobicity or hydrophilicity similar to a degree of hydrophobicity or hydrophilicity of a material of the second region. As the corrosion inhibitor bonds to the surface of the first region, the surface of the first region and the surface of the second region may have similar degree of hydrophobicity or hydrophilicity. Accordingly, the polishing rates in the first region and the second region are similar, and dishing during CMP operation can be alleviated. In some embodiments, the corrosion inhibitor includes a short carbon chain corrosion inhibitor with a carbon number less than 20. Compared to a long carbon chain corrosion inhibitor, the short carbon chain corrosion inhibitor is apt to bond to the hydrophobic first region.

In some embodiments, after the surface treatment to the first region is performed, the material of the first region has a degree of hydrophilicity similar to a degree of a material of the second region. The polishing slurry can be dispersed on the first region and the second region more uniformly, and thus dishing can be mitigated.

Figure 3:
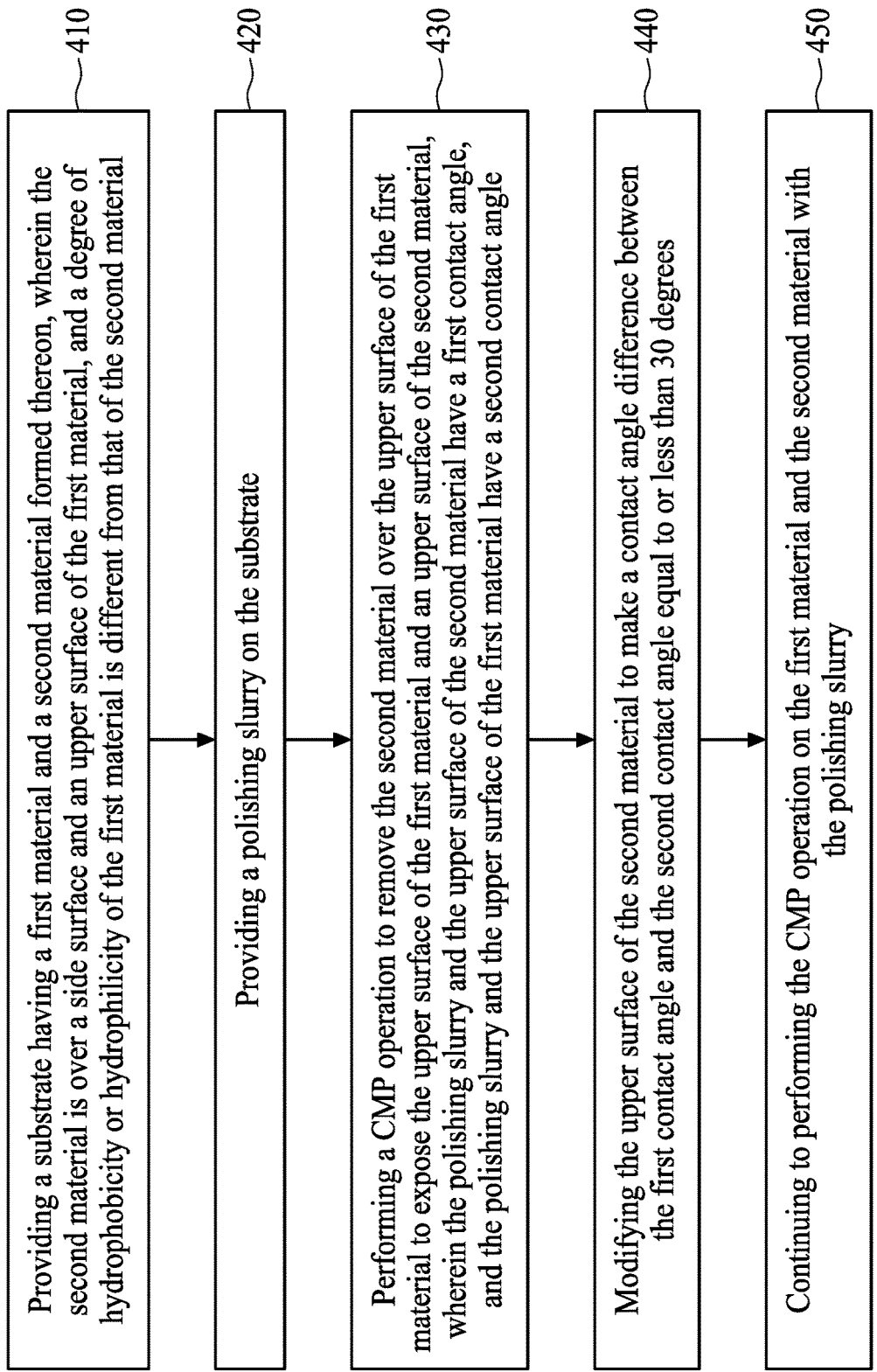
FIG. 3 is a flowchart illustrating a chemical mechanical polishing (CMP) method in accordance with various aspects of the present disclosure.

FIG. 3 is a flowchart illustrating a chemical mechanical polishing (CMP) method in accordance with various aspects of the present disclosure. The method 400 begins with operation 410 in which a substrate is provided, wherein the substrate has a first material and a second material formed thereon, the second material is over a side surface and an upper surface of the first material, and a degree of hydrophobicity or hydrophilicity of the first material is different from that of the second material. The method 400 continues with operation 420 in which a polishing slurry is provided on the substrate. The method 400 proceeds with operation 430 in which a CMP operation is performed to remove the second material over the upper surface of the first material to expose the upper surface of the first material and an upper surface of the second material, wherein the polishing slurry and the upper surface of the second material have a first contact angle, and the polishing slurry and the upper surface of the first material have a second contact angle. The method 400 proceeds with operation 440 in which the upper surface of the second material is modified to make a contact angle difference between the first contact angle and the second contact angle equal to or less than 30 degrees. The method 400 proceeds with operation 450 in which the CMP operation is continued to perform on the first material and the second material with the polishing slurry.

The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method.

Figure 4:
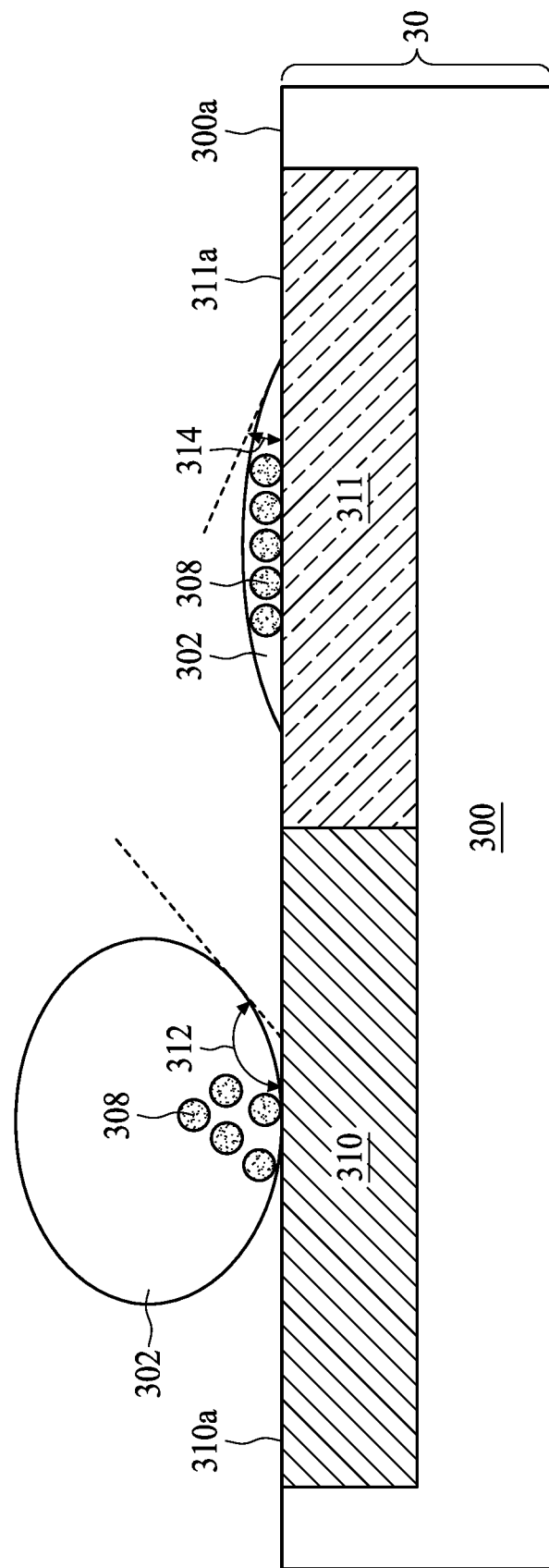
FIG. 4, FIG. 5 and FIG. 6 are schematic diagrams of a planarization method in accordance with various aspects of some embodiments of the present disclosure.
Figure 5:
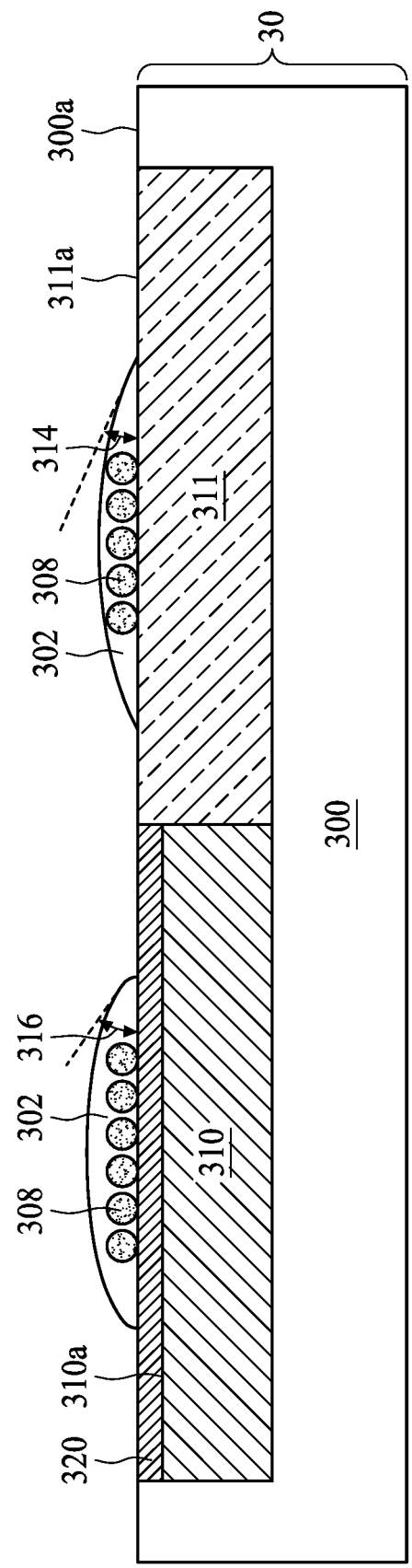
Figure 6:
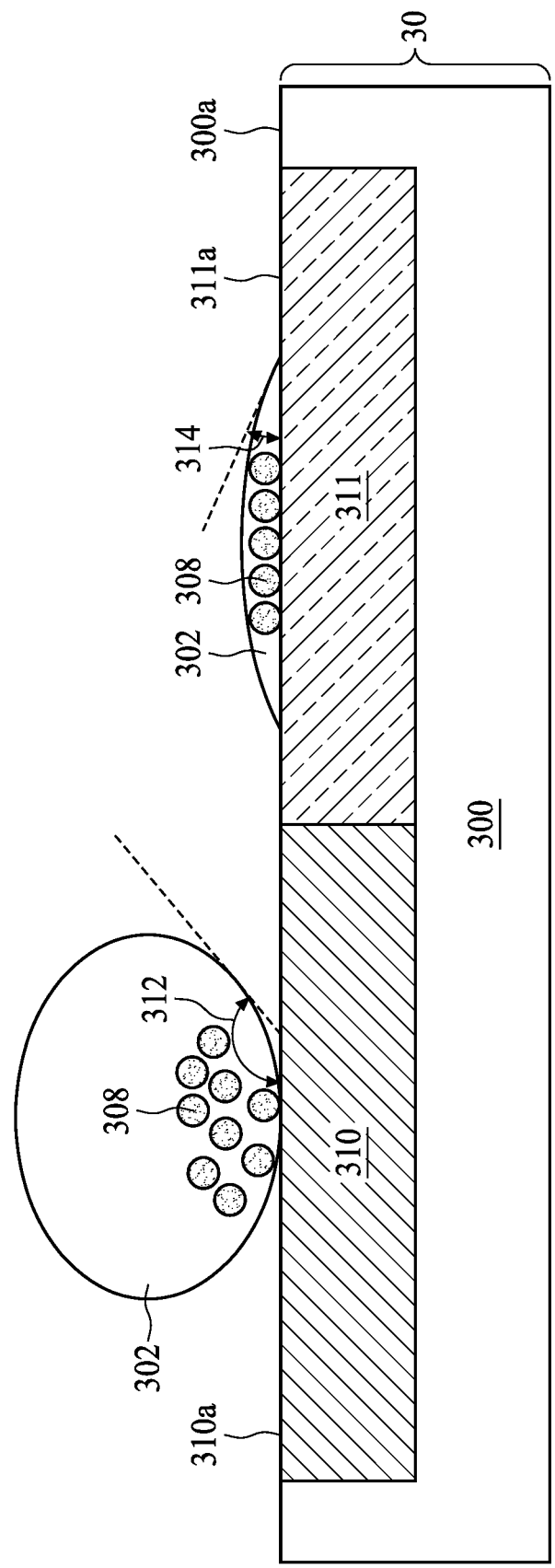

FIG. 4, FIG. 5 and FIG. 6 are schematic diagrams of a planarization method in accordance with various aspects of some embodiments of the present disclosure. As shown in FIG. 4, a semiconductor structure 30 including a substrate 300 is provided. In some embodiments, a surface 300a of the substrate 300 includes a first region 310 and a second region 311. The first region 310 and the second region 311 include different materials. In some embodiments, the first region 310 is a hydrophobic region having a hydrophobic surface 310a, and the second region 311 is a hydrophilic region having a hydrophilic surface 311a. In some embodiments, the semiconductor structure 30 may include a dielectric layer having via holes, and a metal layer over the dielectric layer and filled in the via holes. By way of example, the first region 310 may be formed from metal material such as cobalt, copper, tungsten or other suitable metal materials, while the second region 311 may be formed from dielectric material such as silicon oxide, silicon nitride or other suitable dielectric materials. In some other embodiments, the first region 310 may be formed from semiconductor material such as polycrystalline silicon, while the second region 311 may be formed from dielectric material such as silicon oxide, silicon nitride or other suitable dielectric materials. In some other embodiments, the first region 310 may be formed from dielectric material such as silicon nitride, while the second region 311 may be formed from dielectric material such as silicon oxide. In some embodiments, a polishing slurry 302 is dispensed on the surface 310a of the first region 310 and the surface 311a of the second region 311. In some embodiments, the polishing slurry 302 includes a plurality of polishing abrasives 308. In some embodiments, the plurality of polishing abrasives 308 is made of corundum, tungsten carbide, silicon carbide (carborundum), titanium carbide, boron, boron nitride, rhenium diboride, stishovite, titanium diboride, diamond, carbonado, or the like.

As the surface 310a of the first region 310 is hydrophobic, the polishing slurry 302 shows a bead shaped drop having a smaller contact area with the surface 310a. On the other hand, as the surface 311a of the second region 311 is hydrophilic, the polishing slurry 302 is spread out on the surface 311a of the second region 311, and has a larger contact area with the surface 311a. As a result, the polishing slurry 302 and the surface 310a of the first region 310 have a first contact angle 312, the polishing slurry 302 and the surface 311a of the second region 311 have a second contact angle 314, and the first contact angle 312 is larger than the second contact angle 314. In some embodiments, the first contact angle 312 is greater than 90 degrees. In some embodiments, the contact angle difference between the first contact angle 312 and the second contact angle 314 is greater than 30 degrees.

As shown in FIG. 5, a surface treatment is carried out to modify the surface 310a of the first region 310 by transforming a material of the first region 310 into another material. In some embodiments, the surface 310a of the first region 310 is modified by adding a pH adjuster to the polishing slurry 302. In some embodiments, the material of the first region 310 is transformed to form an oxide compound on the surface 310a of the first region 310. In some embodiments, the pH adjuster includes maleic acid, sulfuric acid, nitric acid, potassium hydroxide, amine, sodium hypochlorite, tetramethylammonium hydroxide (TMAH), ammonium, or a combination thereof. In some embodiments, the material of the first region 310 is apt to be oxidized in an alkaline environment, such as cobalt or copper. In some embodiments, the material of the first region 310 is apt to be oxidized in an acidic environment, such as tungsten. Therefore, the pH value of the polishing slurry 302 may be modified to form the oxide compound based on the material of the first region 310. When the material of the first region 310 is apt to be oxidized in an alkaline environment, an alkaline pH adjuster is selected to enhance formation of metal oxide such as cobalt oxide or copper oxide on the surface 310a of the first region 310. When the material of the first region 310 is apt to be oxidized in an acidic environment, an acidic pH adjuster is selected to enhance formation of metal oxide such as tungsten oxide on the surface 310a of the first region 310.

As shown in FIG. 5, the polishing slurry 302 and the oxide compound 320 on the surface 310a of the first region 310 have a third contact angle 316 after the surface treatment. In some embodiments, the third contact angle 316 is less than 90 degrees. In some embodiments, the contact angle difference between the second contact angle 314 and the third contact angle 316 is equal to or less than 30 degrees. With the hydrophilic oxide compound 320, the surface 310a of the first region 310 and the second surface 311a of the second region 311 can have similar degree of hydrophilicity. Accordingly, the polishing slurry 302 can be dispersed on the oxide compound 320 of the first region 310 and the surface 311a of the second region 311 more uniformly after the surface treatment. As a result, the plurality of polishing abrasives 308 can also be dispersed on the oxide compound 320 of the first region 310 and the surface 311a of the second region 311 more uniformly during CMP operation.

As shown in FIG. 6, as the substrate 300 is polished with the polishing slurry 302, the oxide compound 320 on the surface 310a of the first region 310 may be polished as well, and the surface 310a of the first region 310 may be exposed. The surface 310a of the first region 310, however, will keep on being oxidized, and a new layer of oxide compound 320 will be formed as the pH adjuster of the polishing slurry 302 is presented as illustrated in FIG. 5. Accordingly, the surface 310a of the first region 310 and the second surface 311a of the second region 311 can constantly have similar degree of hydrophilicity, and therefore the surface 310a of the first region 310 and the second surface 311a of the second region 311 can be polished uniformly.

In some embodiments, after the surface of the substrate 300 is planarized, the pH value of the polishing slurry 302 can be adjusted to inhibit formation of the oxide compound 320 on the surface 310a of the first region 310.

Figure 7:
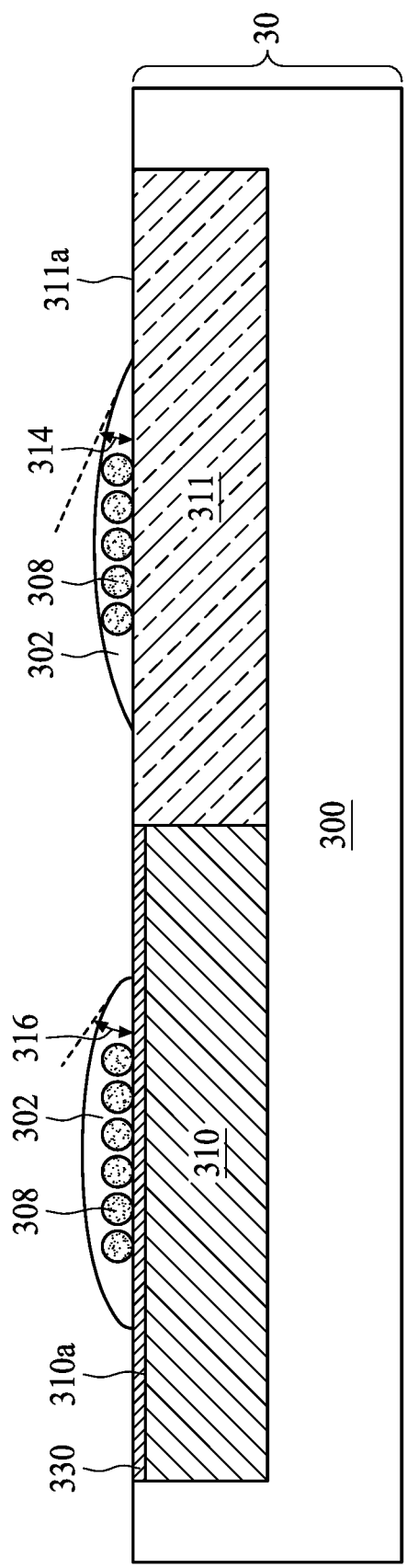
FIG. 7, FIG. 7A and FIG. 8 are schematic diagrams of a planarization method in accordance with various aspects of some embodiments of the present disclosure.
Figure 7A:
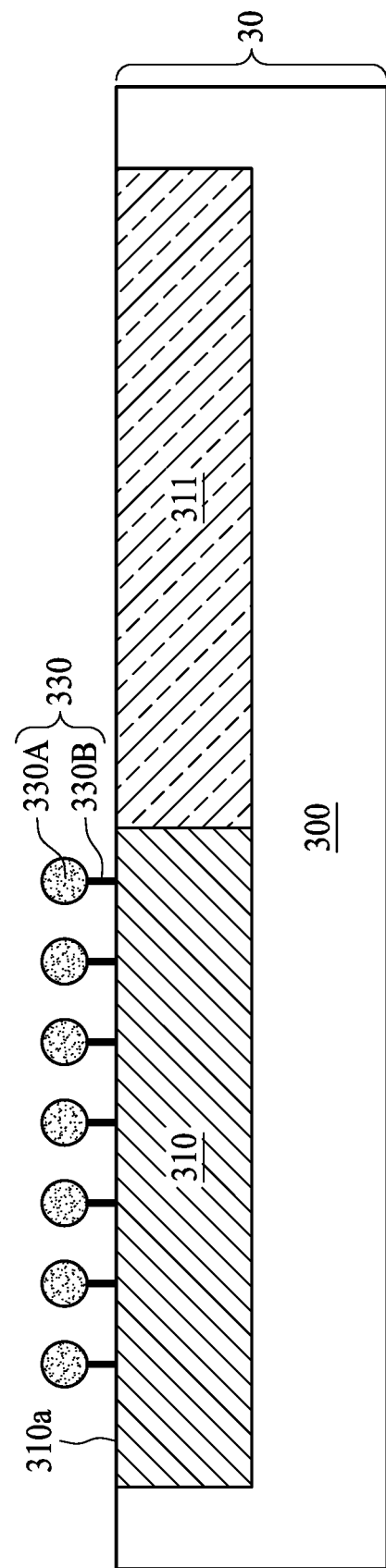
Figure 8:
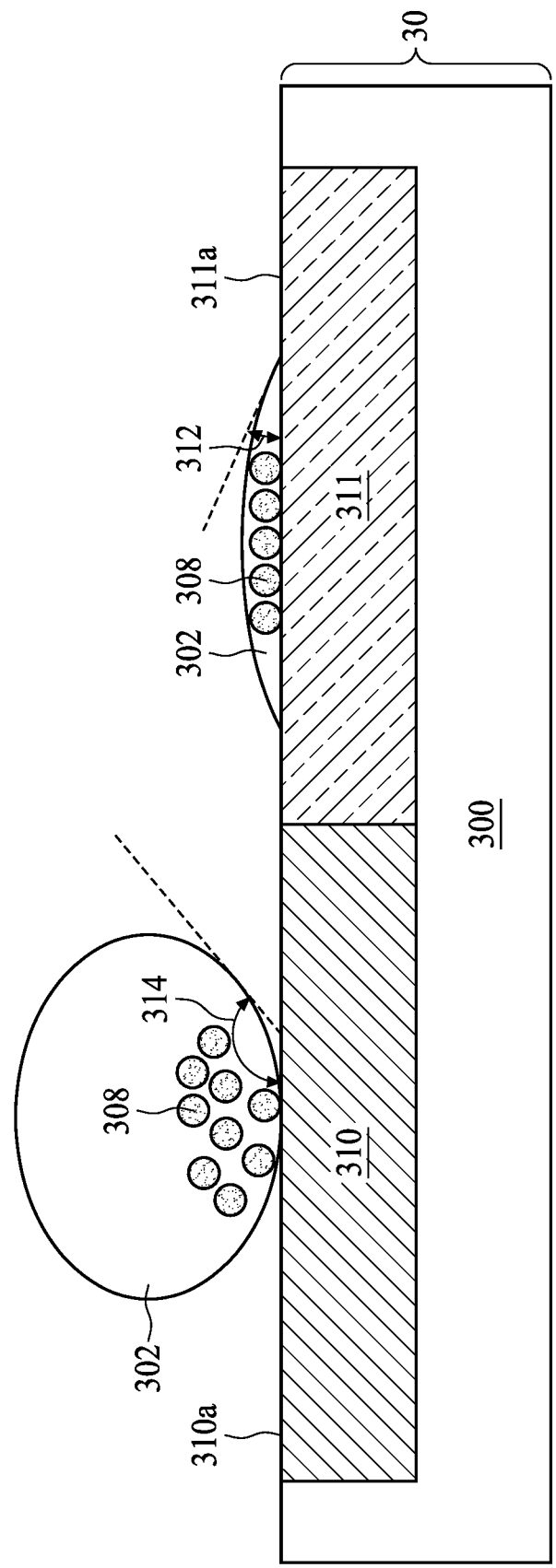

FIG. 7, FIG. 7A and FIG. 8 are schematic diagrams of a planarization method in accordance with various aspects of some embodiments of the present disclosure. As shown in FIG. 7, the surface 310a of the first region 310 is hydrophobic, and the surface 311a of the second region 311 is hydrophilic.

As shown in FIG. 7A, a surface treatment is carried out to modify the surface 310a of the first region 310 by adding a surfactant 330 to the polishing slurry 302. The surfactant 330 may be configured to prevent particles such as polishing abrasives 308 from being adhered to the surfaces 310a and 311a. In some embodiments, the material of the surfactant 330 is selected to be bonded to the surface 310a of the first region 310 than to the surface 311a of the second region 311. For example, the surfactant 330, which is being neutral or carries a few positive charges, is liable to bond to the surface 310a of the first region 310 than to the surface 311a of the second region 311 by ionic bond because the hydrophobic first region 310 carries fewer negative charges than the hydrophilic second region 311. With the surfactant 330 bonded to the surface 310a of the first region 310, the surface 310a of the first region 310 can be modified to have a degree of hydrophilicity similar to that of the surface 311a of the second region 311. Accordingly, the polishing slurry 302 and the surface 310a of the first region 310 with the surfactant 330 adhered to have the third contact angle 316. In some embodiments, the third contact angle 316 is less than 90 degrees. In some embodiments, the contact angle difference between the second contact angle 314 and the third contact angle 316 is equal to or less than 30 degrees. The surfactant 330 may help to alter the degree of hydrophilicity of the first region 310, and therefore reduces the contact angle difference between the second contact angle 314 and the third contact angle 316.

As shown in FIG. 7A, the surfactant 330 includes a hydrophilic end 330A and a hydrophobic end 330B. In some embodiments, the hydrophobic end 330B is bonded to the surface 310a of the first region 310 by ionic bond, for example, while the hydrophilic end 330A is in the polishing slurry 302. In some embodiments, the surfactant 330 includes an anionic surfactant, a cationic surfactant, an amphoteric surfactant, a nonionic surfactant, or a combination thereof. Examples of the material for the surfactant 330 may include, but is not limited to, Acetate cationic surfactant, sulfate cationic surfactant, polyacrylic acid or the like. As the surfactant 330 alters the degree of hydrophilicity of the first region 310, the polishing slurry 302 can be dispersed on the surface 310a of the first region 310 and the surface 311a of the second region 311 more uniformly. Accordingly, the plurality of polishing abrasives 308 can also be dispersed on the surface 310a of the first region 310 and the surface 311a of the second region 311 more uniformly during CMP operation.

As shown in FIG. 8, as the substrate 300 is polished with the polishing slurry 302, the surfactant 330 on the surface 310a of the first region 310 may be polished as well, and the surface 310a of the first region 310 may be exposed. The surfactant 330 of the polishing slurry 302, however, will keep on bonding to the surface 310a of the first region 310 as illustrated in FIG. 7. Accordingly, the surface 310a of the first region 310 and the second surface 311a of the second region 311 can constantly have similar degree of hydrophilicity, and therefore the surface 310a of the first region 310 and the second surface 311a of the second region 311 can be polished uniformly. In some embodiments, after the surface of the substrate 300 is planarized, the surfactant 330 of the polishing slurry 302 can be reduced such that the surfactant 330 is not bonded to the surface 310a of the first region 310.

Figure 9:
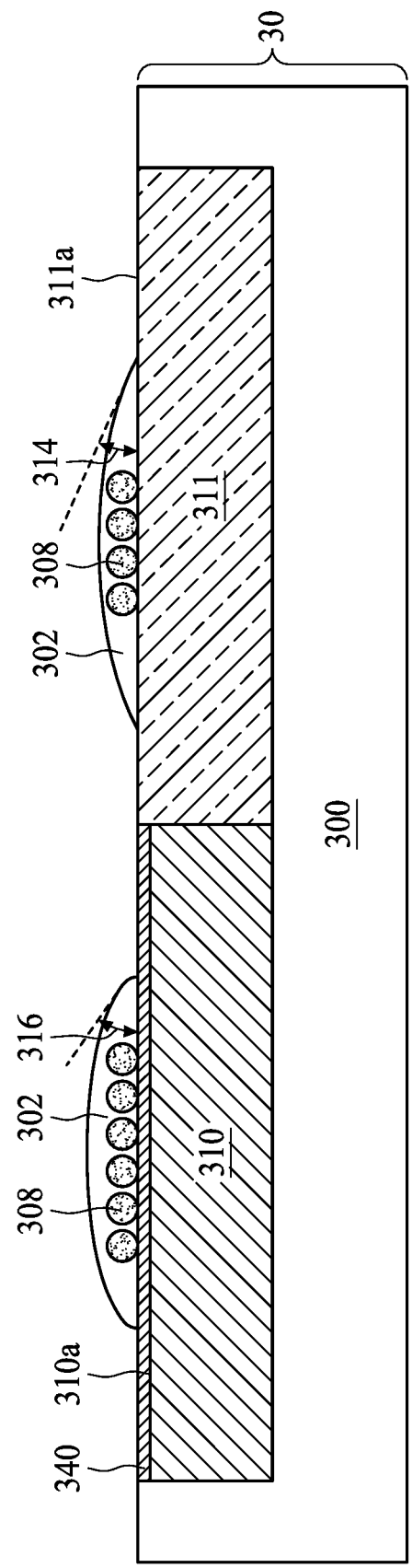
FIG. 9, FIG. 9A and FIG. 10 are schematic diagrams of a planarization method in accordance with various aspects of some embodiments of the present disclosure.
Figure 9A:
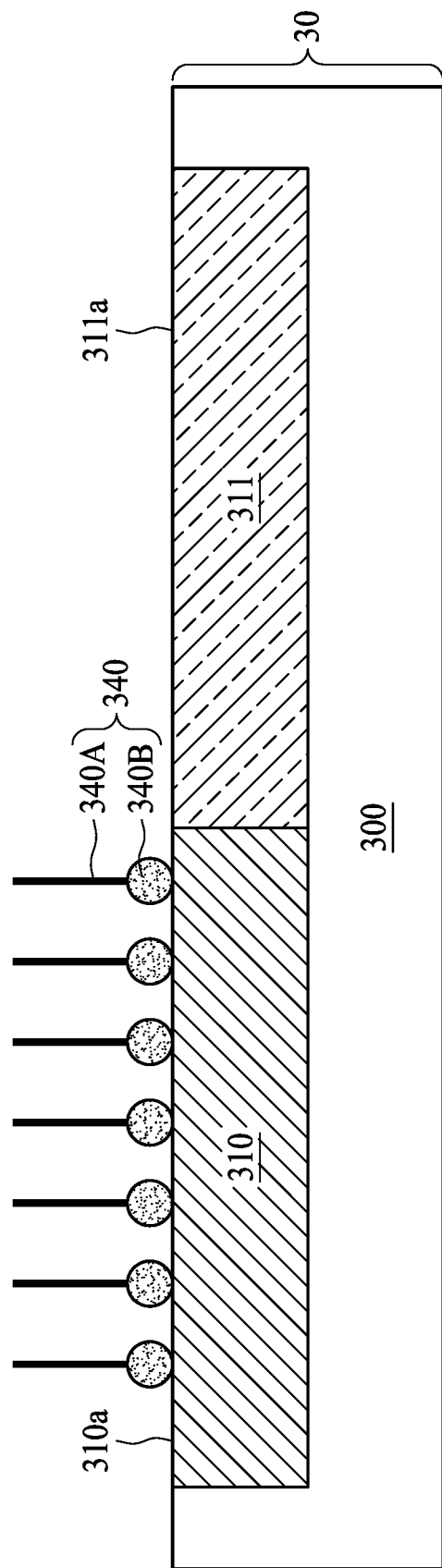
Figure 10:
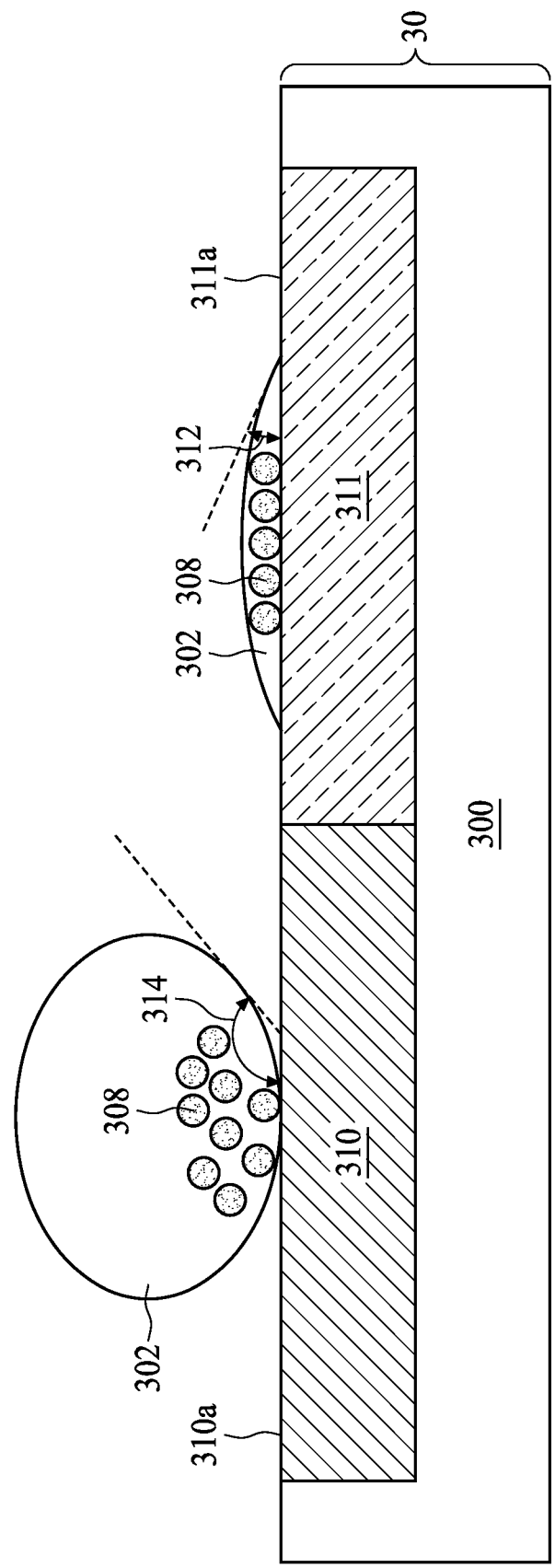

FIG. 9, FIG. 9A and FIG. 10 are schematic diagrams of a planarization method in accordance with various aspects of some embodiments of the present disclosure. As shown in FIG. 9, the surface 310a of the first region 310 is hydrophobic and the surface 311a of the second region 311 is hydrophilic.

As shown in FIG. 9A, a surface treatment is performed to modify the surface 310a of the first region 310 by adding a corrosion inhibitor 340 to the polishing slurry 302. The corrosion inhibitor 340 may be configured to alleviate corrosion of the material (such as metal) of the first region 310 or the second region 311. In some embodiments, the material of the corrosion inhibitor 340 is selected to be bonded to the surface 310a of the first region 310 than to the surface 311a of the second region 311. For example, the corrosion inhibitor 340, which is being neutral or carries a few positive charges, is liable to bond to the surface 310a of the first region 310 than to the surface 311a of the second region 311 by ionic bond because the hydrophobic first region 310 carries fewer negative charges than the hydrophilic second region 311. With the corrosion inhibitor 340 bonded to the surface 310a of the first region 310, the surface 310a of the first region 310 can be modified to have a degree of hydrophilicity similar to that of the surface 311a of the second region 311. Accordingly, the polishing slurry 302 and the surface 310a of the first region 310 with the corrosion inhibitor 340 adhered to have the third contact angle 316. In some embodiments, the third contact angle 316 is less than 90 degrees. In some embodiments, the contact angle difference between the second contact angle 314 and the third contact angle 316 is equal to or less than 30 degrees. The corrosion inhibitor 340 may help to alter the degree of hydrophilicity of the first region 310, and therefore reduces the contact angle difference between the second contact angle 314 and the third contact angle 316.

As shown in FIG. 9A, the corrosion inhibitor 340 may include a carbon chain 340A and a functional group 340B. In some embodiments, the functional group 340B is bonded to the surface 310a of the first region 310 by ionic bond, hydrogen bond or the like, while the carbon chain 340A is in the polishing slurry 302. In some embodiments, the corrosion inhibitor 340 includes a short carbon chain corrosion inhibitor with a carbon number less than 20. Compared to a long carbon chain corrosion inhibitor, the short carbon chain corrosion inhibitor 340 is more hydrophilic. Therefore, the short carbon chain corrosion inhibitor 340 bonded to the hydrophobic first region 310 can increase the degree of hydrophilicity of the surface 310a of the first region 310. Examples of the material for the corrosion inhibitor 340 may include, but is not limited to, Benzotriazole (BTA), phosphate cationic inhibitor, amine cationic inhibitor, histidine or the like. Accordingly, the polishing slurry 302 can be dispersed on the surface 310a of the first region 310 and the surface 311a of the second region 311 more uniformly after the surface 310a of the first region 310 is modified by the corrosion inhibitor 340. Accordingly, the plurality of polishing abrasives 308 can also be dispersed on the surface 310a of the first region 310 and the surface 311a of the second region 311 more uniformly during CMP operation.

As shown in FIG. 10, as the substrate 300 is polished with the polishing slurry 302, the corrosion inhibitor 340 on the surface 310a of the first region 310 may be polished as well, and the surface 310a of the first region 310 may be exposed. The corrosion inhibitor 340 of the polishing slurry 302, however, will keep on bonding to the surface 310a of the first region 310 as illustrated in FIG. 9. Accordingly, the surface 310a of the first region 310 and the second surface 311a of the second region 311 can constantly have similar degree of hydrophilicity, and therefore the surface 310a of the first region 310 and the second surface 311a of the second region 311 can be polished uniformly. In some embodiments, after the surface of the substrate 300 is planarized, the corrosion inhibitor 340 of the polishing slurry 302 can be reduced such that the corrosion inhibitor 340 is not bonded to the surface 310a of the first region 310.

Figure 11A:
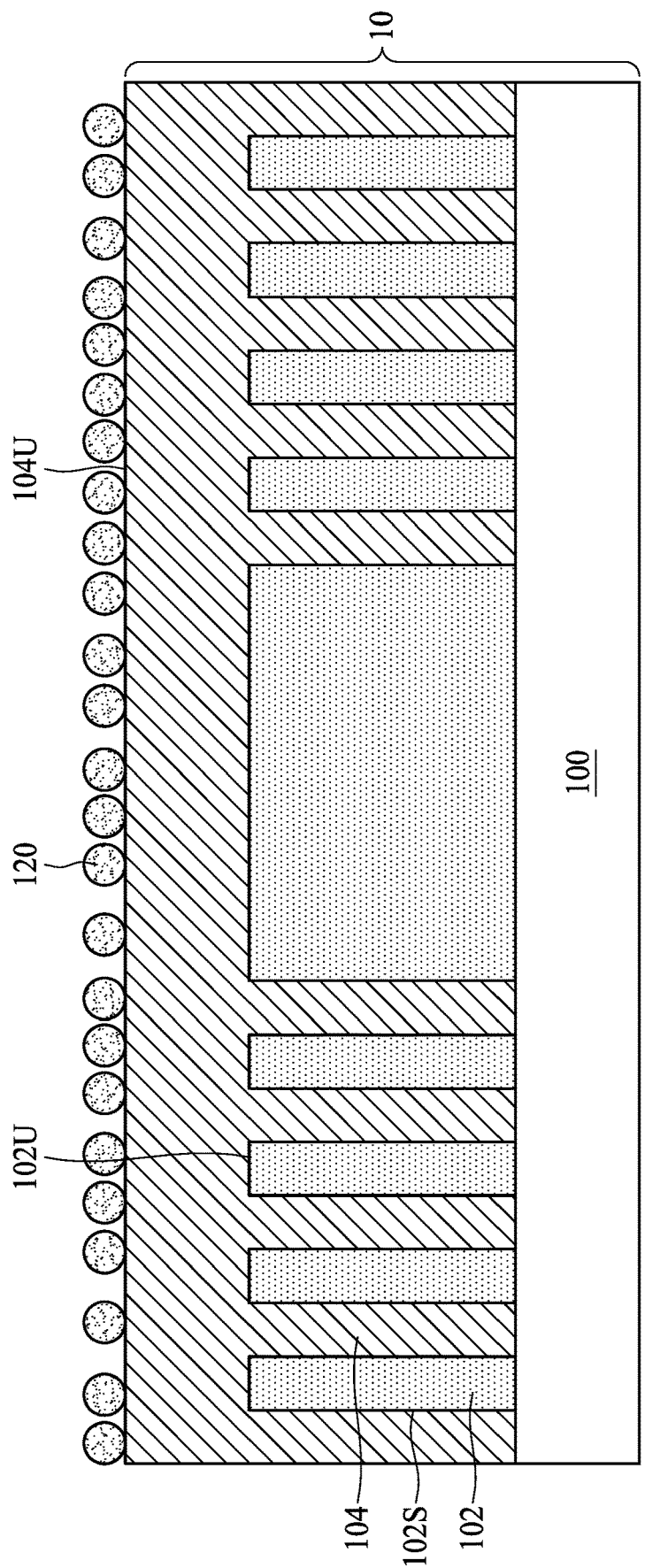
FIG. 11A, FIG. 11B, FIG. 11C and FIG. 11D are schematic cross-sectional views illustrating a CMP method in accordance with some embodiments of the present disclosure.

FIG. 11A, FIG. 11B, FIG. 11C and FIG. 11D are schematic cross-sectional views illustrating a CMP method in accordance with some embodiments of the present disclosure. As shown in FIG. 11A, a semiconductor structure 10 is provided. In some embodiments, the semiconductor structure 10 includes a substrate 100, a first material 102 and a second material 104. The second material 104 is formed over a side surface 102S and an upper surface 102U of the first material 102. The first material 102 and the second material 104 have different degrees of hydrophobicity or hydrophilicity. In some embodiments, the first material 102 may include a dielectric material such as silicon oxide compound or silicon nitride compound configured as dielectric layer. In some embodiments, the second material 104 may include a conductive material such as metal material configured as conductive vias. The second material 104 over the first material 102 may need to be removed to form a plurality of separated conductive vias, and the upper surface 102U of the first material 102 and the upper surface 104U of the second material 104 may need to be planarized for successive operations. In some other embodiments, the first material 102 may include a dielectric material such as silicon oxide compound configured as a dielectric layer, and the second material 104 may include a semiconductor material such as polycrystalline silicon configured as poly gate or dummy poly gate. In some other embodiments, the first material 102 may include a dielectric material such as silicon nitride compound configured as a hard mask, and the second material 104 may include another dielectric material such as silicon oxide compound configured as a dielectric layer.

A polishing slurry 120 may be dispensed over the semiconductor structure 10, and a CMP operation may be performed to remove the second material 104 over the first material 102. As shown in FIG. 1A, since the second material 104 has the same degree of hydrophobicity or hydrophilicity, the abrasives of the polishing slurry 120 may be uniformly distributed over the second material 104.

Figure 11B:
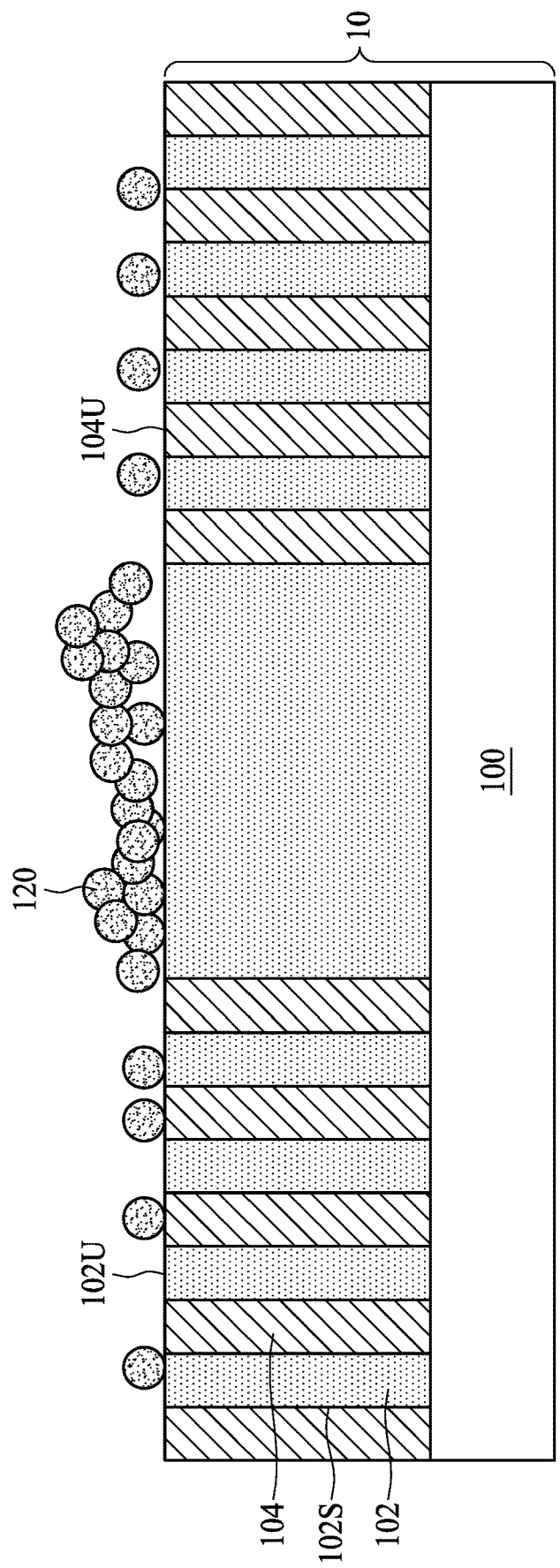

As shown in FIG. 11B, when the second material 104 over the first material 102 is polished by the CMP operation, the upper surface 102U of the first material 102 and the upper surface 104U of the second material 104 will be exposed. Since the the first material 102 and the second material 104 have different degrees of hydrophobicity or hydrophilicity, the polishing slurry 120 and the upper surface 104U of the second material 104 have a first contact angle (as shown in FIG. 4, FIG. 8 or FIG. 10), and the polishing slurry 120 and the upper surface 102U of the first material 102 have a second contact angle (as shown in FIG. 4, FIG. 8 or FIG. 10).

Figure 11C:
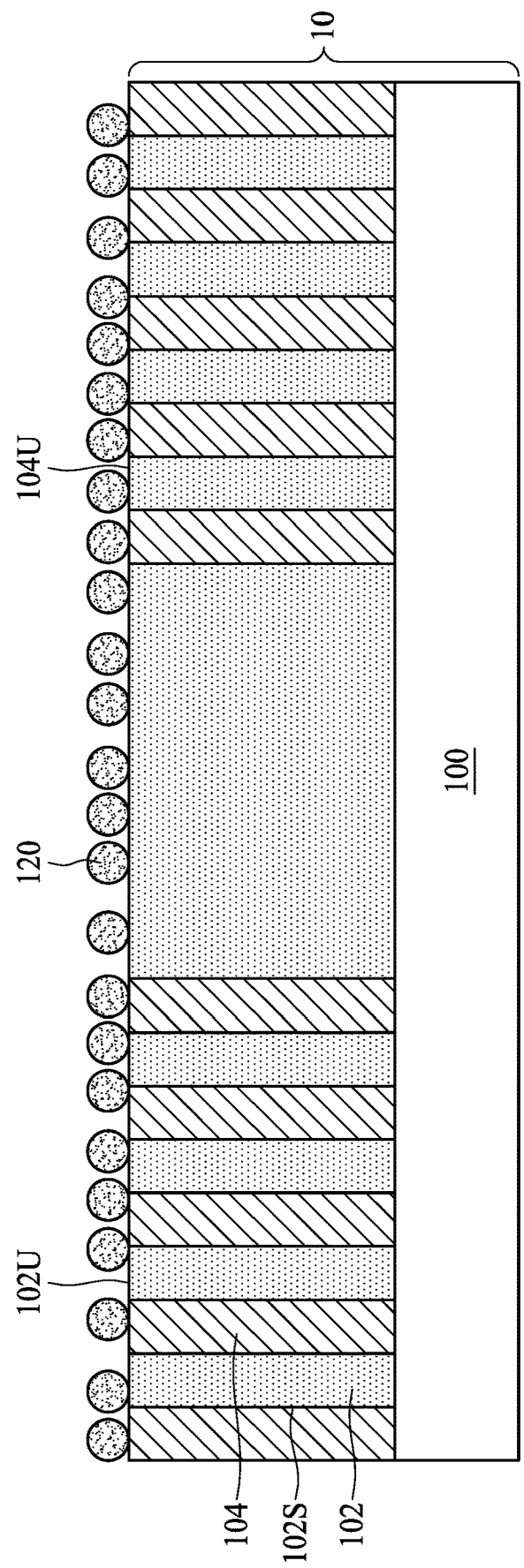
Figure 11D:
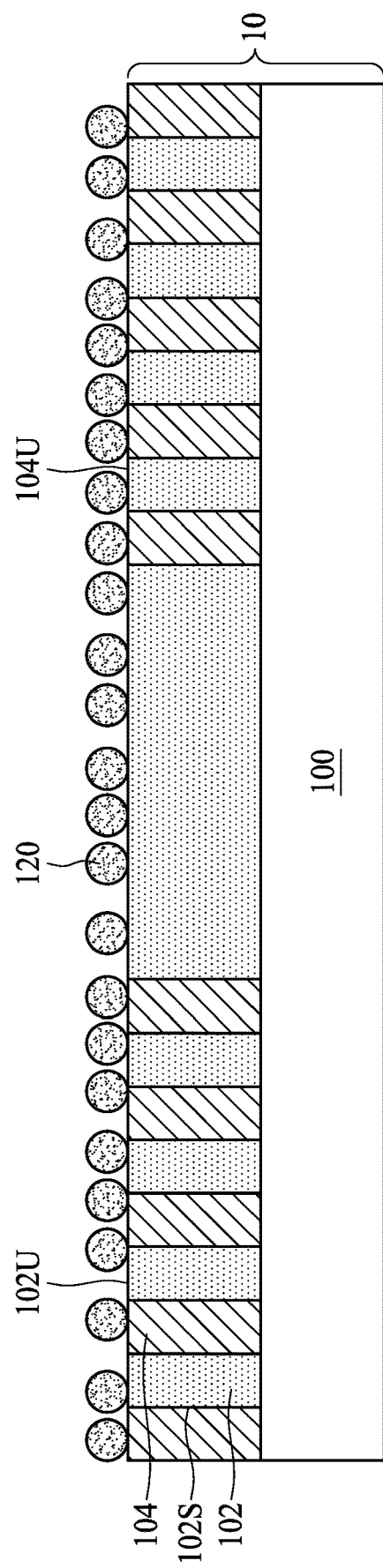

As shown in FIG. 11C, the upper surface 104U of the second material 104 is modified to make a contact angle difference between the first contact angle and the second contact angle equal to or less than 30 degrees. The upper surface 104U of the second material 104 may be modified by adding the pH adjuster, surfactant or corrosion inhibitor as described in the embodiments of FIGS. 4-10, for example.

As shown in FIG. 1D, the CMP operation is continued to perform on the first material 102 and the second material 104 with the polishing slurry 120 uniformly dispensed on the upper surface 102U of the first material 102 and the upper surface 104U of the second material 104. Accordingly, dishing during the CMP operation may be mitigated.

In some embodiments of the present disclosure, the planarization method uses a surface treatment to modify the surface of the substrate or its overlying layer(s), such that the substrate or the overlying layer(s) may have similar degree of hydrophobicity or hydrophilicity. With similar degree of hydrophobicity or hydrophilicity across different regions, the polishing slurry can be uniformly dispersed on the substrate. Consequently, dishing can be alleviated during the planarization operation.

In some embodiments of the present disclosure, a planarization method is provided. The planarization method comprises providing a substrate, wherein a surface of the substrate includes a first region and a second region having different degrees of hydrophobicity or hydrophilicity, performing a surface treatment to the first region to render the degree of hydrophobicity or hydrophilicity of the first region in proximity to that of the second region, and polishing the surface of the substrate using a polishing slurry to planarize the surface of the substrate.

In some embodiments of the present disclosure, a chemical mechanical polishing (CMP) method is provided. The CMP method comprises providing a substrate having a first material and a second material formed thereon, wherein the second material is over a side surface and an upper surface of the first material, and a degree of hydrophobicity or hydrophilicity of the first material is different from that of the second material; providing a polishing slurry on the substrate; performing a CMP operation to remove the second material over the upper surface of the first material to expose the upper surface of the first material and an upper surface of the second material, wherein the polishing slurry and the upper surface of the second material have a first contact angle, and the polishing slurry and the upper surface of the first material have a second contact angle; modifying the upper surface of the second material to make a contact angle difference between the first contact angle and the second contact angle equal to or less than 30 degrees; and continuing to perform the CMP operation on the first material and the second material with the polishing slurry.

In some embodiments of the present disclosure, a chemical mechanical polishing (CMP) method is provided. The CMP method comprises providing a substrate having a dielectric material and a metal material formed thereon, wherein the metal material is over a side surface and an upper surface of the dielectric material, and the dielectric material and the metal material have different degrees of hydrophobicity or hydrophilicity; providing a polishing slurry over the substrate; performing a CMP operation to remove the metal material over the upper surface of the dielectric material to expose the upper surface of the dielectric material and an upper surface of the metal material; performing a surface treatment to the metal material to render the degree of hydrophobicity or hydrophilicity of the metal material in proximity to that of the dielectric material, such that the polishing slurry is uniformly dispensed on the upper surface of the dielectric material and the upper surface of the metal material; and continuing to perform the CMP operation on the dielectric material and the metal material with the polishing slurry uniformly dispensed on the upper surface of the dielectric material and the upper surface of the metal material.

The foregoing outlines features of several embodiments so that those skilled in the art may better understand the aspects of the present disclosure. Those skilled in the art should appreciate that they may readily use the present disclosure as a basis for designing or modifying others and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A planarization method, comprising:
   providing a substrate, wherein the substrate includes a first region and a second region having different degrees of hydrophobicity or hydrophilicity, the second region includes a top portion disposed over the first region and covering an upper surface of the first region, and the second region covers a side surface of the first region;
   polishing the top portion of the second region with a polishing slurry until the upper surface of the first region is exposed, wherein the polishing exposes an upper surface of the second region; and
   continuing polishing and performing a surface treatment to adjust the degree of hydrophobicity or hydrophilicity of the first region and the second region with the polishing slurry,
   wherein the first region comprises a metal material including cobalt, copper or tungsten, the second region comprises a dielectric material including silicon oxide compound or silicon nitride compound, the polishing slurry and the upper surface of the second region have a first contact angle, and the polishing slurry and the upper surface of the first region have a second contact angle, wherein the surface treatment keeps a contact angle difference between the first contact angle and the second contact angle being equal to or less than 30 degrees during the polishing, and keeps the upper surface of the first region and the upper surface of the second region planar to each other.

2. The planarization method of claim 1, wherein the surface treatment comprises transforming a material of the first region into another material having a degree of hydrophobicity or hydrophilicity different from a degree of hydrophobicity or hydrophilicity of the material of the first region.

3. The planarization method of claim 2, wherein the transforming the material of the first region into another material comprises adding a pH adjuster to the polishing slurry.

4. The planarization method of claim 3, wherein the pH adjuster comprises maleic acid, sulfuric acid, nitric acid, potassium hydroxide, amine, sodium hypochlorite, tetramethylammonium hydroxide (TMAH), ammonium, or a combination thereof.

5. The planarization method of claim 1, wherein the surface treatment comprises adding a surfactant to the polishing slurry, the surfactant is-bonded to the surface of the first region during the polishing and performing the surface treatment, and the surfactant comprises a functional group.

6. The planarization method of claim 5, wherein the surfactant comprises anionic surfactant, cationic surfactant, amphoteric surfactant, nonionic surfactant, or a combination thereof.

7. The planarization method of claim 1, wherein the surface treatment comprises adding a corrosion inhibitor to the polishing slurry, the corrosion inhibitor is bonded to the surface of the first region during the polishing and performing the surface treatment.

8. The planarization method of claim 7, wherein the corrosion inhibitor comprises a short carbon chain corrosion inhibitor with a carbon number less than 20.

9. A chemical mechanical polishing (CMP) method, comprising:
   providing a substrate having a first material comprising a metal including cobalt, copper or tungsten, and a second material comprising a dielectric material including a silicon oxide compound formed thereon, wherein the second material includes a top portion disposed over the first material and covering an upper surface of the first material, and the second material covers a side surface of the first material;
   providing a polishing slurry on the top portion of the second material of the substrate;
   performing a CMP operation with the polishing slurry to remove the top portion of the second material over the upper surface of the first material until the upper surface of the first material and an upper surface of the second material are exposed; and
   continuing the CMP operation and performing a surface treatment to modify the upper surface of the first material and the upper surface of the second material by the polishing slurry, wherein the modifying the upper surface of the second material comprises transforming the metal into a metal oxide compound during the CMP operation,
   wherein the polishing slurry and the upper surface of the second material have a first contact angle, and the polishing slurry and the upper surface of the first material have a second contact angle,
   wherein the surface treatment keeps a contact angle difference between the first contact angle and the second contact angle being equal to or less than 30 degrees during the CMP operation and keeps the upper surface of the first material and the upper surface of the second material planar to each other.

10. The CMP method of claim 9, wherein the upper surface of the second material is hydrophobic, and the upper surface of the first material is hydrophilic region.

11. The CMP method of claim 9, wherein the transforming metal into metal oxide compound comprises adding a pH adjuster to the polishing slurry.

12. The CMP method of claim 9, wherein the modifying the upper surface of the second material comprises adding a surfactant to the polishing slurry, the surfactant is bonded to the upper surface of the second material during the CMP operation such that the contact angle difference between the first contact angle and the second contact angle is reduced.

13. The CMP method of claim 9, wherein the modifying the upper surface of the second material comprises adding a corrosion inhibitor to the polishing slurry, the corrosion inhibitor is bonded to the upper surface of the second material during the CMP operation such that the contact angle difference between the first contact angle and the second contact angle is reduced.

14. A chemical mechanical polishing (CMP) method, comprising:
    providing a substrate having a dielectric material comprising silicon oxide compound or silicon nitride compound and a metal material comprising cobalt, copper or tungsten formed thereon, wherein the metal material includes a top portion disposed over the dielectric material and covering an upper surface and a side surface of the dielectric material;
    providing a polishing slurry on the top portion of the metal material of the substrate;
    performing a CMP operation with the polishing slurry to remove the top portion of the metal material over the upper surface of the dielectric material until the upper surface of the dielectric material and an upper surface of the metal material are exposed; and
    continuing the CMP operation and performing a surface treatment to adjust degree of hydrophobicity or hydrophilicity of the metal material and the dielectric material by the polishing slurry,
    wherein the polishing slurry and the upper surface of the dielectric material have a first contact angle, and the polishing slurry and the upper surface of the metal material have a second contact angle,
    wherein the CMP operation and the surface treatment keep a contact angle difference between the first contact angle and the second contact angle being equal to or less than 30 degrees during the CMP operation.

15. The CMP method of claim 14, wherein the surface treatment further comprises transforming the metal material into a metal oxide compound by adding a pH adjuster to modify a pH value of the polishing slurry, and the dielectric material comprises a semiconductor oxide compound during the CMP operation.

16. The CMP method of claim 15, wherein the pH adjuster comprises maleic acid, sulfuric acid, nitric acid, potassium hydroxide, amine, sodium hypochlorite, tetramethylammonium hydroxide (TMAH), ammonium, or a combination thereof.

17. The CMP method of claim 14, wherein the surface treatment further comprises adding a surfactant to the polishing slurry, the surfactant is bonded to the upper surface of the metal material during the CMP operation, and the surfactant comprises a functional group.

18. The CMP method of claim 17, wherein the surfactant comprises anionic surfactant, cationic surfactant, amphoteric surfactant, nonionic surfactant, or a combination thereof.

19. The CMP method of claim 14, wherein the corrosion inhibitor comprises a short carbon chain corrosion inhibitor with a carbon number less than 20.

20. The CMP method of claim 14, wherein the polishing slurry further comprises polishing abrasives, chemical reagents and other additives.

* * * * *